United States Patent
Ha et al.

(10) Patent No.: US 11,322,334 B2
(45) Date of Patent: May 3, 2022

(54) GRID SAMPLE PRODUCTION APPARATUS FOR ELECTRON MICROSCOPE

(71) Applicant: XTEM BIOLAB CO., LTD., Seoul (KR)

(72) Inventors: Nam Chul Ha, Seoul (KR); Inseong Jo, Seoul (KR)

(73) Assignee: XTEM BIOLAB CO., LTD., Seoul (KR)

( * ) Notice: Subject to any disclaimer, the term of this patent is extended or adjusted under 35 U.S.C. 154(b) by 3 days.

(21) Appl. No.: 17/259,563

(22) PCT Filed: Jul. 1, 2019

(86) PCT No.: PCT/KR2019/007980
§ 371 (c)(1),
(2) Date: Jan. 12, 2021

(87) PCT Pub. No.: WO2020/013499
PCT Pub. Date: Jan. 16, 2020

(65) Prior Publication Data
US 2021/0166912 A1    Jun. 3, 2021

(30) Foreign Application Priority Data

Jul. 12, 2018 (KR) .................. 10-2018-0081070
Apr. 1, 2019 (KR) .................. 10-2019-0037927

(51) Int. Cl.
*H01J 37/28* (2006.01)
*H01J 37/26* (2006.01)

(52) U.S. Cl.
CPC ............ *H01J 37/28* (2013.01); *H01J 37/261* (2013.01); *H01J 2237/28* (2013.01)

(58) Field of Classification Search
CPC .. H01J 37/00; H01J 37/02; H01J 37/28; H01J 37/261; H01J 2237/28; G01N 2001/2826;
(Continued)

(56) References Cited

U.S. PATENT DOCUMENTS

| 2012/0006784 A1 | 1/2012 | Lin et al. |
| 2016/0245732 A1* | 8/2016 | Rémigy ................ H01J 37/26 |
| 2017/0363549 A1 | 12/2017 | Balashov |

FOREIGN PATENT DOCUMENTS

| KR | 10-2007-0065502 A | 6/2007 |
| KR | 10-2016-0016399 A | 2/2016 |

(Continued)

OTHER PUBLICATIONS

International Search Report for PCT/KR2019/007980 dated Oct. 21, 2019 from Korean Intellectual Property Office.

*Primary Examiner* — Jason L McCormack
(74) *Attorney, Agent, or Firm* — Revolution IP, PLLC

(57) ABSTRACT

A grid sample production apparatus includes: a frame in which an internal space is formed; a grid unit which is vertically provided on an upper side of the frame, and grips a grid at a lower end; a filter unit which is provided to be movable inside the frame and selectively absorbs the protein liquid of the grid gripped at one end of the grid unit; a laser unit which is provided on one side of the filter unit; a screen unit which is disposed inside the frame and on which a diffraction image appears by the laser from the laser unit by being diffracted by the grid; and a liquid amount analysis unit which analyzes an illuminance of the diffraction image appeared on the screen unit and determines whether the protein liquid of the grid is disposed in an appropriate amount.

15 Claims, 23 Drawing Sheets

(58) Field of Classification Search
CPC ....... G01N 2001/06113; G01N 1/2813; G01N 1/42
USPC .......................................... 250/306, 307, 311
See application file for complete search history.

(56) References Cited

FOREIGN PATENT DOCUMENTS

| KR | 10-1665057 B1 | 10/2016 |
|----|---------------|---------|
| KR | 10-1690670 B1 | 12/2016 |
| KR | 10-2017-0143443 A | 12/2017 |

\* cited by examiner

GRID SAMPLE PRODUCTION APPARATUS FOR ELECTRON MICROSCOPE

TECHNICAL FIELD

The present invention relates to a grid sample production apparatus, and more particularly, a grid sample production apparatus for an electron microscope capable of producing a grid sample in which an appropriate amount of a protein liquid is disposed by measuring in real time the amount of protein liquid disposed in a plurality of holes formed in a grid for the electron microscope.

BACKGROUND

In general, a grid for an electron microscope is used to acquire an image of a protein liquid by using an electron microscope, has holes having a diameter of several micrometers (um) unit formed on a very thin carbon film called a holey grid at intervals of several micrometers (um), and is mainly used in a low-temperature electron microscope. That is, in the grid for the electron microscope, an image of a protein sample may be obtained by using the electron microscope by applying a protein solution to holes which are formed in a regular arrangement.

In other words, the protein solution applied to the grid is selectively removed by using filter paper, so that an appropriate amount of the protein solution remains in the holes of the grid to be formed. When the appropriate amount of the protein solution remains in the holes of the grid, vitreous ice is formed by rapid freezing the protein solution with low-temperature liquid ethane, and the grid sample, in which vitreous ice is formed, is observed with the electron microscope to acquire an image of the protein solution. That is, in order to obtain a good image of the grid observed by using the low-temperature electron microscope as described above, it is important that the protein solution remaining in the grid holes is disposed in an appropriate amount. An appropriate amount of the protein solution has to be disposed in order to obtain ice of an appropriate thickness when being quickly frozen.

However, in order to check whether ice having an appropriate thickness is formed in the grid sample for the electron microscope of the related art, the grid has to be checked and determined through the electron microscope. There is a disadvantage in that it takes a lot of time and cost because processes of preparing the grid sample in which the protein solution is disposed in the holes and quickly freezing and confirming the grid sample through the electron microscope are repeatedly performed until an optimal image is obtained. Therefore, it is required to measure the amount of protein solution in the holes of the grid before observing it with the electron microscope, but the size of the hole in the grid is about 2 um, and the interval between the plurality of holes is too small, about 3 um. Thus, it is difficult to see the grid hole with an optical microscope or the like, and even if the grid hole can be observed, it is difficult to check whether the protein solution disposed in the hole in an appropriate amount.

As a technology related to a grid production apparatus of a low-temperature electron microscope, Korean Patent Laid-Open No. 10-2016-0016399 is disclosed.

SUMMARY OF INVENTION

Technical Problem

The present invention is created to solve the above-described problems, and an object of the present invention is to provide a grid sample production apparatus for an electron microscope in which it is possible to quickly check whether an amount of a liquid is appropriately disposed in grid holes, and quickly obtain a grid sample that provides a high-resolution image at low cost, thereby improving production efficiency.

Solution to Problem

In order to achieve the object described above, according to the present invention, there is provided a grid sample production apparatus for an electron microscope for producing a grid sample in which a protein liquid is disposed in an appropriate amount in holes of a grid in which a plurality of holes are formed, the grid sample production apparatus including: a frame in which an internal space is formed; a grid unit which is vertically provided on an upper side of the frame, provided so as to move up and down, and grips a grid at a lower end; a filter unit which is provided to be movable inside the frame and selectively absorbs the protein liquid of the grid gripped at one end of the grid unit; a laser unit which is provided on one side of the filter unit to irradiate the grid disposed at one end of the grid unit with a laser; a screen unit which is disposed inside the frame and on which a diffraction image appears by the laser from the laser unit by being diffracted by the grid; and a liquid amount analysis unit which analyzes an illuminance of the diffraction image appeared on the screen unit and determines whether the protein liquid of the grid is disposed in an appropriate amount.

Here, the grid unit may include a first cylinder which is vertically provided at an upper portion of the frame and slides in a vertical direction by expansion and contraction, a tweezer fixing portion which is provided at a lower end of the first cylinder and has a magnet on one surface, a tweezer adapter which is provided with an iron plate on one surface, is coupled to one surface of the tweezer fixing portion by being in contact therewith, and has a tweezer receiving groove formed at a lower end thereof, and a tweezer portion which has one end inserted into the tweezer receiving groove to be coupled and the other ends gripping the grid.

In addition, the tweezer fixing portion is preferably further formed of a coupling groove on one surface thereof, the tweezer adapter is preferably further provided with a protrusion portion corresponding to the coupling groove on one surface thereof, and the protrusion portion is preferably inserted into the coupling groove to be disposed.

In addition, the tweezer portion preferably includes tweezers that grip the grid between the other ends spaced apart from each other, and a tweezer holder that is formed in a "c" shape and maintains a gripped state of the grid by inserting the tweezers to an open side thereof.

In addition, the filter unit may include a second cylinder which slides in a horizontal direction by expansion and contraction on one inner surface of the frame, a moving frame which is coupled to the second cylinder to move, a filter holder which protrudes from the moving frame and is formed of iron, a filter magnet body which is formed of a magnet and coupled to one surface of the filter holder, and a filter paper which has one surface that adheres to the filter magnet body, is disposed on the filter holder, is formed of the grid holes, and allows one surface to come into contact with the grid by the movement of the second cylinder to absorb the liquid from the grid.

In addition, the laser unit may be provided in the moving frame, moved by the second cylinder, and irradiate the grid with a laser penetrating through the grid hole.

In addition, the screen unit may include an aluminum plate provided on the other inner surface of the frame, and a screen paper which is provided on one surface of the aluminum plate and on which the diffraction image appears.

In addition, the liquid amount analysis unit may include an illuminance sensor unit which is provided on the screen unit to measure an illuminance of the diffraction image appeared on the screen unit, a data storage unit which is connected to the illuminance sensor unit to receive and store an illuminance value measured by the illuminance sensor unit, and a liquid amount determination unit which analyzes in real time the illuminance value stored in the data storage unit and compares the illuminance value with a preset illuminance value to determine whether the protein liquid disposed in the grid is disposed in an appropriate amount.

In addition, the liquid amount analysis unit preferably further includes a first camera which is provided on one inner surface of the frame unit to photograph a diffraction image appeared on the screen unit, and the data storage unit preferably further includes an image unit which is connected to the first camera to display a diffraction image photographed by the first camera.

In addition, the illuminance sensor unit may include an illuminance sensor which is provided on the other inner surface of the frame and provided with a magnetic body on one surface thereof, and a sensor moving body which is provided on the other surface of the screen unit and formed of a magnet corresponding to the magnetic body of the illumination sensor to control a position of the illumination sensor.

On the other hand, the grid sample production apparatus for an electron microscope may further include: a quick freezing unit which is provided on a lower side of the frame, formed of a communication hole such that an inside thereof communicates with the inside of the frame, and receives the grid from the grid unit for rapid freezing.

Here, the quick freezing unit may include a freezing frame which is provided on the lower side of the frame and formed of a communication hole such that an inside thereof communicates with the inside of the frame, an outer container which is disposed inside the freezing frame, a freezing cup which is provided at a center on an inside of the outer container and accommodates liquid ethane therein to receive the grid for rapid freezing, an inner container which is provided between the outer container and the freezing cup, and has a space formed along an outer circumference of the freezing cup, and a grid storage container which is disposed in the space of the inner container to receive and store a plurality of quick-frozen grids.

In addition, the grid sample production apparatus for an electron microscope preferably further includes: a control unit which is connected to the liquid amount analysis unit, the filter unit, and the grid unit, and when it is determined that the protein liquid of the grid hole analyzed by the liquid amount analysis unit is disposed in an appropriate amount, controls the filter unit to move horizontally so that the filter paper and the grid are separated from each other, and controls the grid unit to be moved downward to automatically transfer the grid to the quick freezing unit.

On the other hand, the grid sample production apparatus for an electron microscope preferably further includes: a humidity control device which is provided on a rear side of the frame and communicates with the inside of the frame to control a humidity inside the frame.

Here, the humidity control device preferably includes a humidity sensor provided inside the frame, a humidification frame provided on the rear side of the frame and accommodating water, cooling fins provided on one side of the humidification frame, a humidity control paper having one side that is provided in the humidification frame and is disposed along the cooling fins, and the other side that is disposed inside the frame, and a cooling fan provided on one side of the cooling fins and rotating in response to the humidity measurement value of the humidity sensor to evaporate water from the humidity control paper disposed on the cooling fins to control the humidity in the frame.

Advantageous Effects

According to an embodiment of the present invention, in the grid sample production apparatus for an electron microscope, the filter unit moves to selectively absorb the protein liquid in the holes of the grid, and irradiation with the laser is performed in the process of absorbing the liquid, so that the illuminance of the diffraction image of the laser appearing in accordance with the amount of protein liquid in the hole of the grid is analyzed in real time. Therefore, it is possible to determine whether the protein liquid is disposed in an appropriate amount in the hole of the grid, so that the grid production efficiency can be improved.

In addition, when it is determined that the protein liquid of the grid analyzed by the liquid amount analysis unit is disposed in an appropriate amount by the control unit, the grid is automatically transferred to the quick freezing unit and frozen, so that ice of a certain thickness can be quickly and accurately formed. Therefore, it is possible to quickly obtain the grid sample which provides an image with high resolution at low cost, and thereby production efficiency can be improved.

BEST MODE FOR INVENTION

Figure 1:
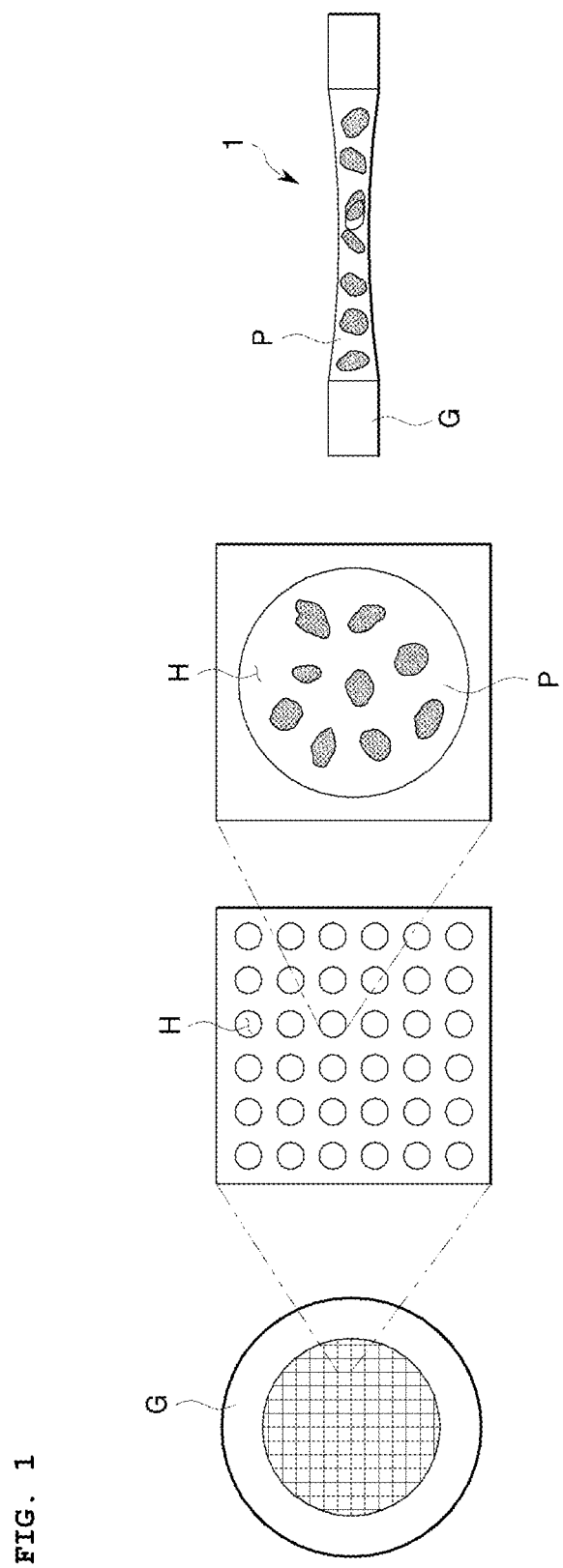
FIG. 1 is a sectional view schematically illustrating a grid for an electron microscope.
Figure 2:
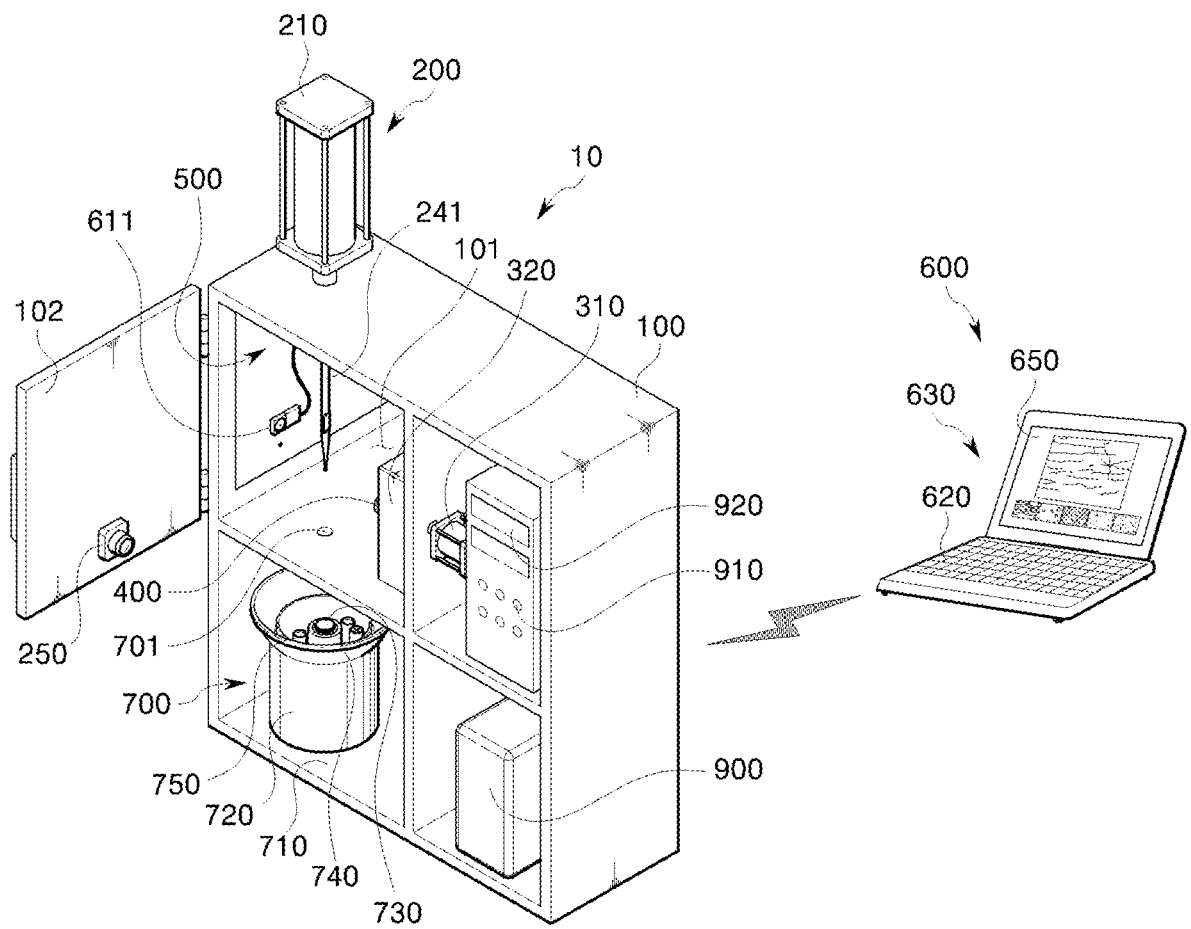
FIG. 2 is a perspective view schematically illustrating a grid sample production apparatus for an electron microscope of the present invention.
Figure 3:
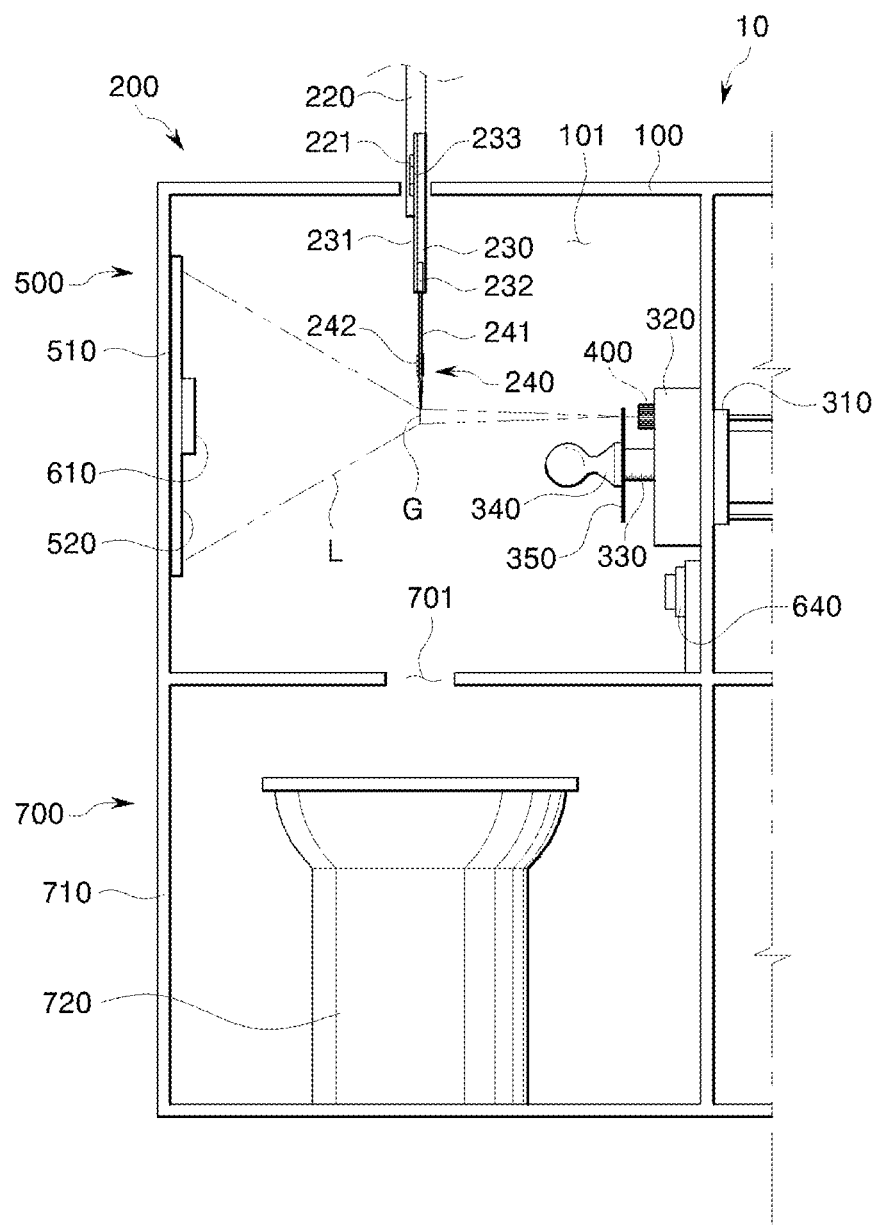
FIG. 3 is a side view of the grid sample production apparatus for an electron microscope of FIG. 2.
Figure 4:
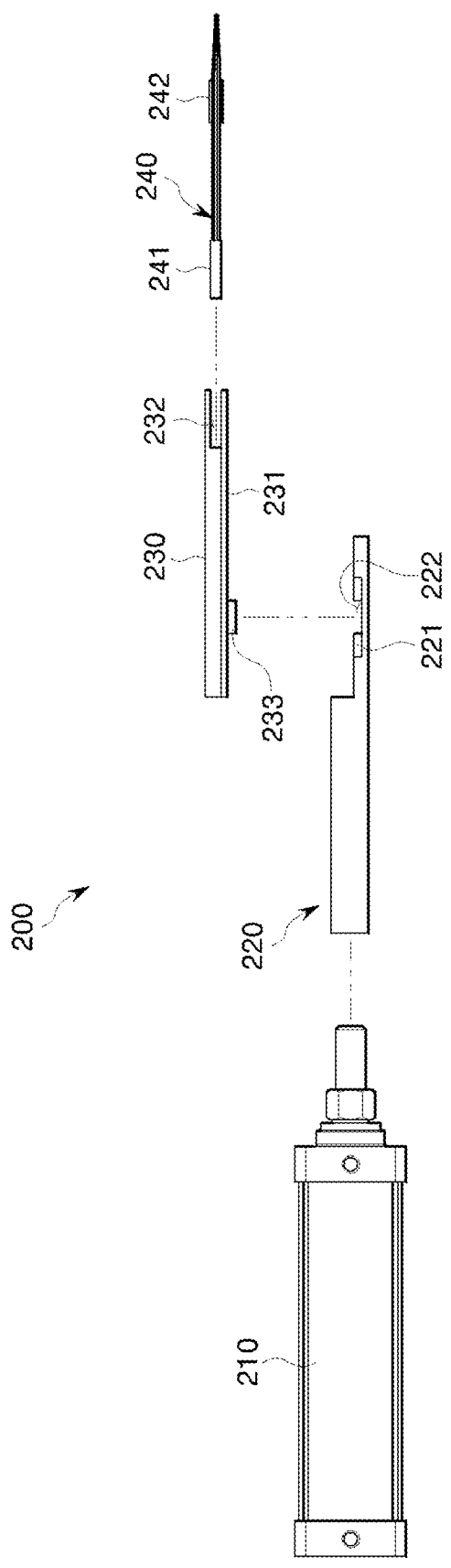
FIG. 4 is a side view illustrating a separated grid unit of the grid sample production apparatus for an electron microscope of FIG. 2.
Figure 5:
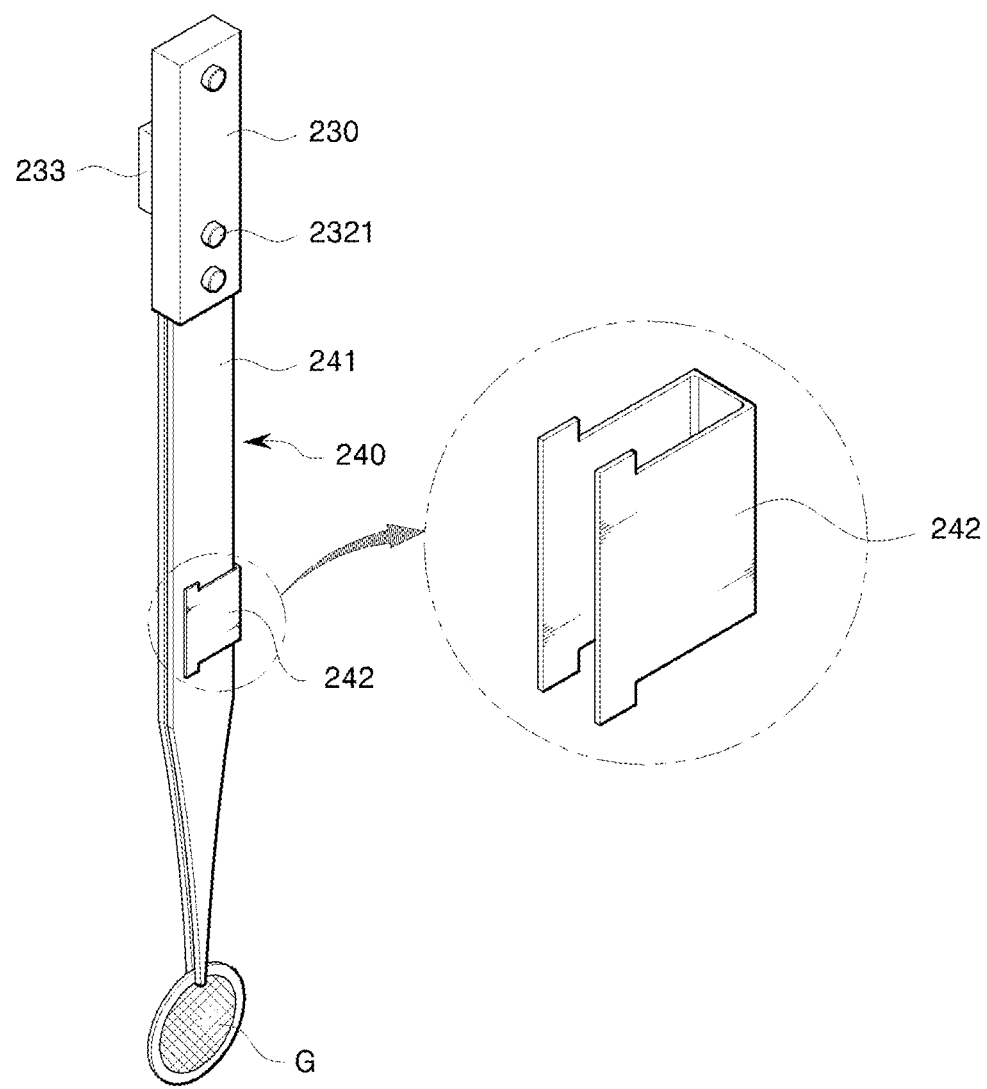
FIG. 5 is a perspective view illustrating a tweezer portion of the grid sample production apparatus for an electron microscope of FIG. 4.
Figure 6:
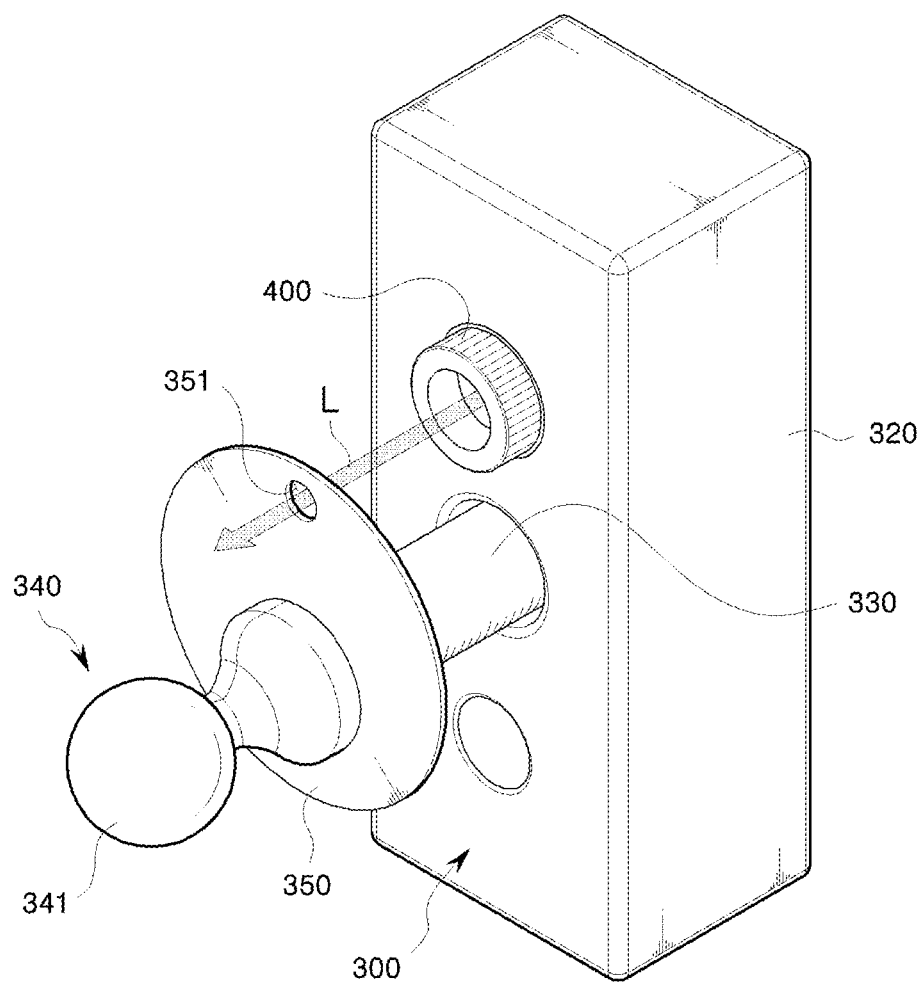
FIG. 6 is a perspective view illustrating a filter unit and a laser unit of the grid sample production apparatus for an electron microscope of FIG. 2.
Figure 7:
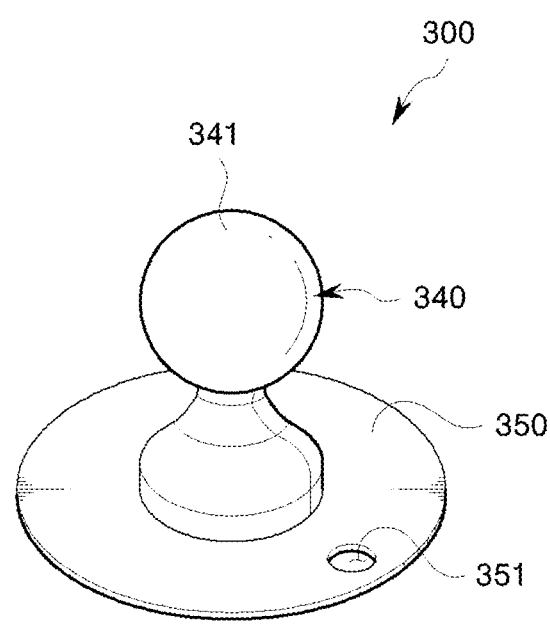
FIG. 7 is a perspective view illustrating a part of the filter unit of the grid sample production apparatus for an electron microscope of FIG. 2.
Figure 8:
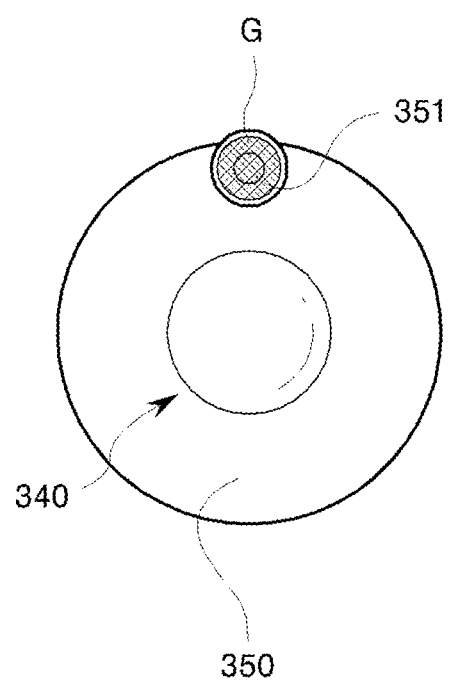
FIG. 8 is a front view of a part of the filter unit of the grid sample production apparatus for an electron microscope of FIG. 7, FIGS. 9 and 10 are side views illustrating a driving state of the filter unit and the laser unit of the grid sample production apparatus for an electron microscope of FIG. 2.
Figure 9:
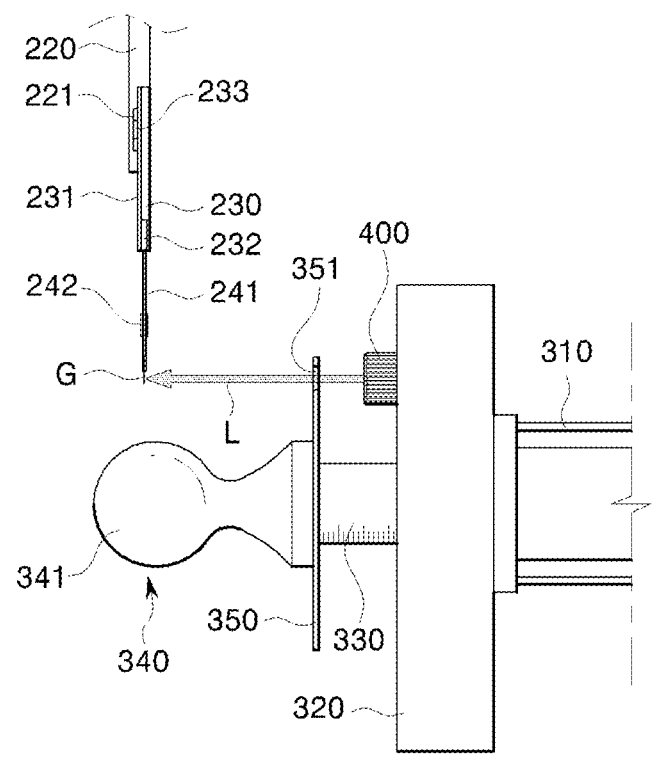
Figure 10:
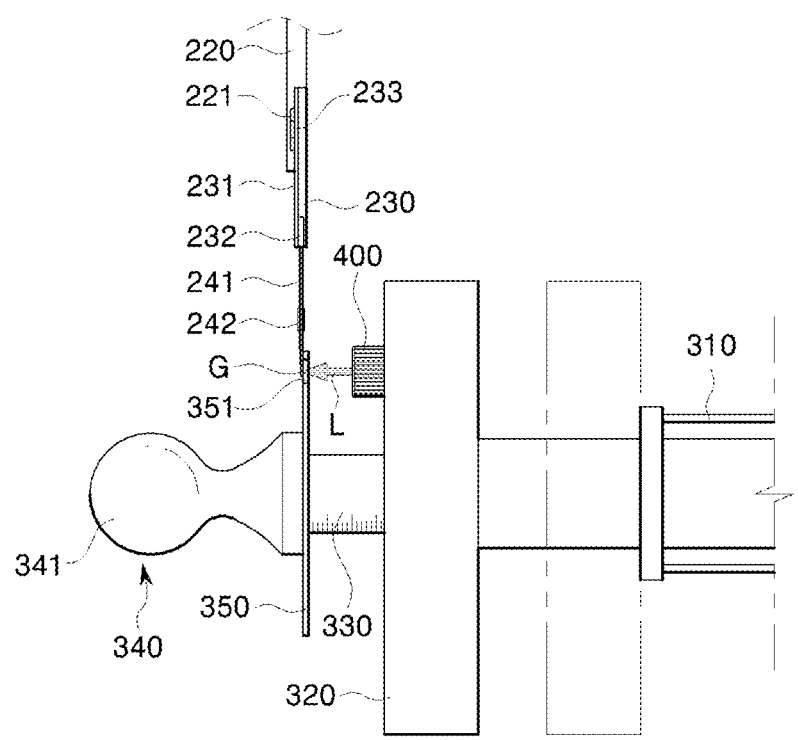
Figure 11:
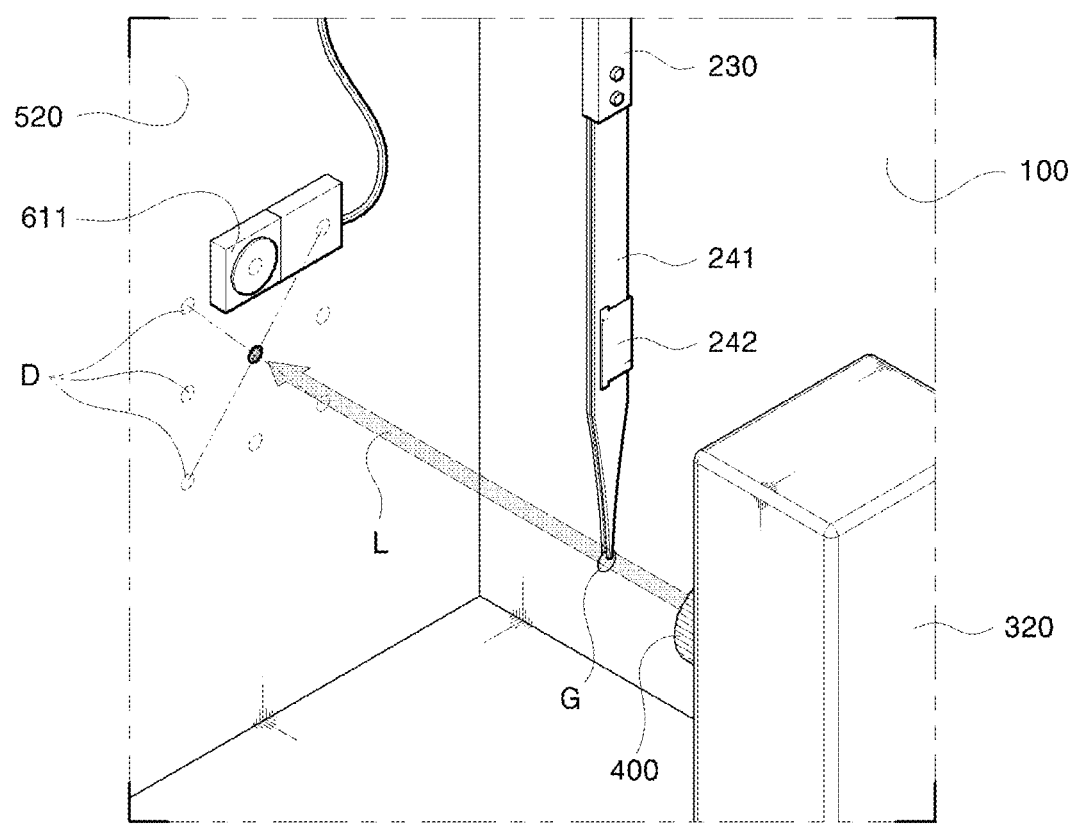
FIG. 11 is a perspective view illustrating a state of irradiation with a laser in the grid sample production apparatus for an electron microscope of FIG. 2.
Figure 12:
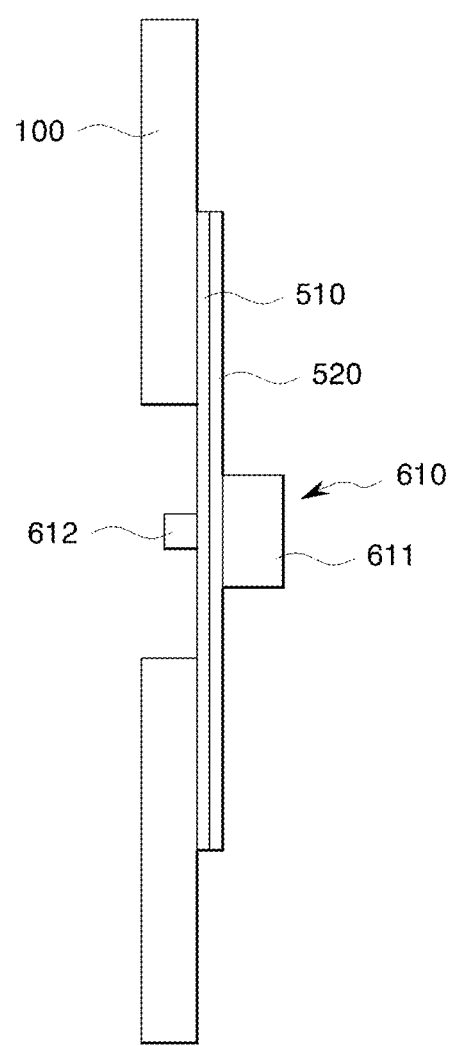
FIG. 12 is a side view of an illuminance sensor portion of the grid sample production apparatus for an electron microscope of FIG. 2.
Figure 13:
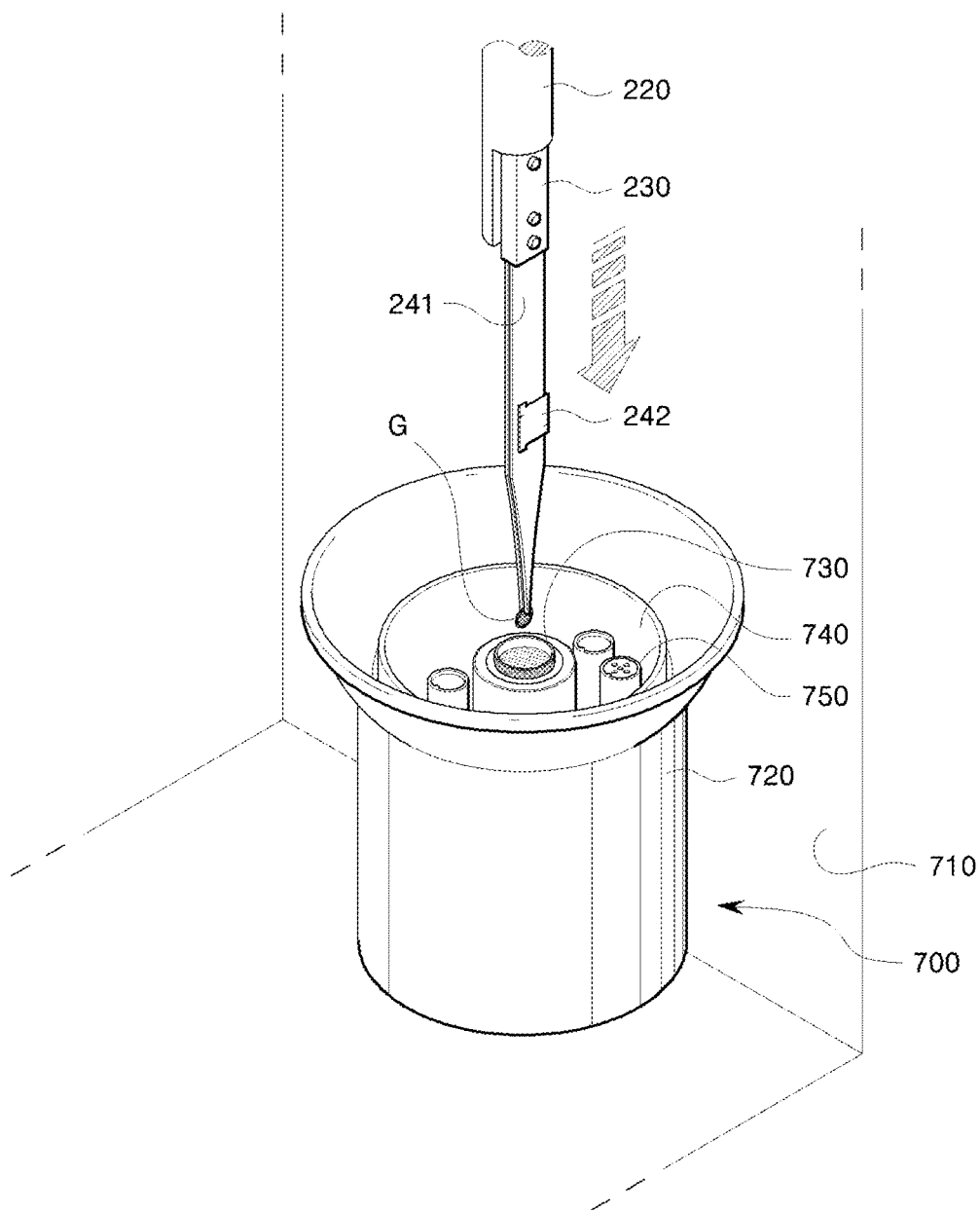
FIG. 13 is a perspective view illustrating a quick freezing unit of the grid sample production apparatus for an electron microscope of FIG. 2.
Figure 14:
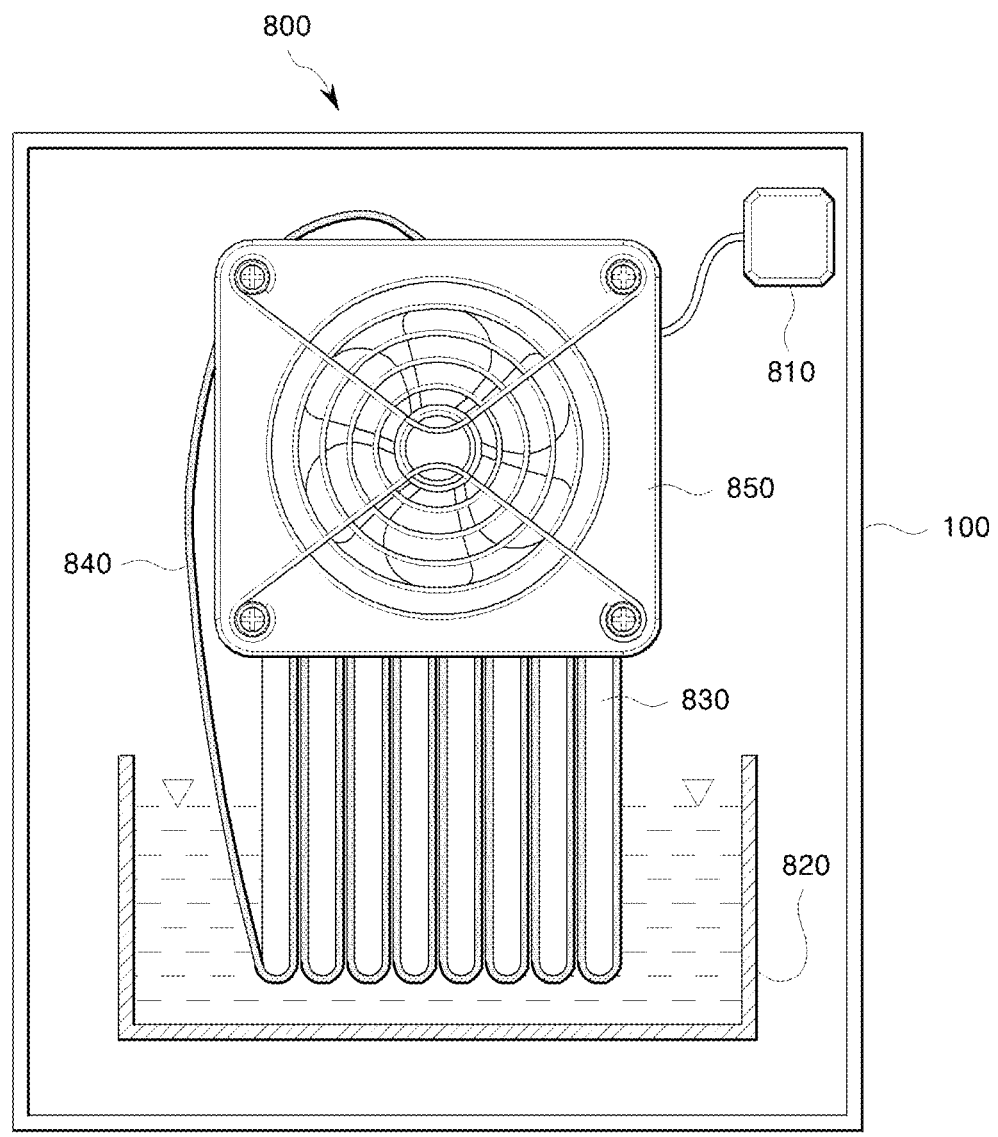
FIG. 14 is a front view illustrating a humidity control device of the grid sample production apparatus for an electron microscope of FIG. 2.

Hereinafter, preferred embodiments of the present invention will be described in detail with reference to the accompanying drawings. Prior to this, terms or words used in the present specification and claims should not be construed as being limited to their usual or dictionary meanings. Based on the principle that the inventor can appropriately define the concept of terms in order to describe his own invention in the best way, it should be interpreted as a meaning and concept consistent with the technical idea of the present invention.

Accordingly, the embodiments described in the present specification and the configurations illustrated in the drawings are only the most preferred embodiments of the present invention, and do not represent all the technical ideas of the present invention. Therefore, at the time of the present application, it should be understood that there may be equivalent variations that can be substituted.

A grid sample production apparatus 10 for an electron microscope according to an embodiment of the present invention is provided to produce a grid sample 1 in which a protein liquid P is disposed in an appropriate amount in a plurality of holes H of a grid G for an electron microscope. The electron microscope is preferably a low-temperature electron microscope, and the protein liquid P may be provided by loading a microliter into the holes H of the grid G by using a micro pipette. The grid sample production apparatus 10 for the electron microscope may include a frame 100, a grid unit 200, a filter unit 300, a laser unit 400, a screen unit 500, a liquid amount analysis unit 600, a quick freezing unit 700, a humidity control device 800, and a control unit 900.

The frame 100 has an inner space 101 formed therein. In addition, a front surface 102 of the frame 100 is provided so as to be able to open and close. That is, the front surface 102 of the frame 100 can be opened to dispose the grid G in the inner space 101, and the front surface 102 of the frame 100 can be closed to form the frame 100 as a dark room.

The grid unit 200 is provided to dispose the grid G at an appropriate position, and is vertically disposed on an upper side of the frame 100 to be movable up and down. The grid unit 200 may grip the grid G at a lower end and move up and down, thereby disposing the grid G at an appropriate position. At this time, the grid G is preferably a plasma-cleaned grid G, is made of a copper material, and has a disk shape having a diameter of approximately 3 mm. In addition, the grid G is formed in a mesh structure inside thereof, and is provided with a carbon material film in which holes H having a diameter of 1 to 3 um are regularly formed. The grid unit 200 may include a first cylinder 210, a tweezer fixing portion 220, a tweezer adapter 230, and a tweezer portion 240.

The first cylinder 210 is provided to move up and down the grid G, and is vertically disposed on the upper portion of the frame 100. That is, the first cylinder 210 can be slid up and down by expansion and contraction, and a lower end of the first cylinder 210 moves from the upper side to the lower side of the frame 100 so that the grid G is movable. In other words, it is preferable that the first cylinder 210 is expanded by about 20 cm. It is preferable that a solenoid valve, an air compressor, and the like are further provided to drive the first cylinder 210 so that the first cylinder 210 is configured to maintain a constant pneumatic pressure, but this is a known technology and a detailed description thereof will be omitted.

The tweezer fixing portion 220 is provided to connect the tweezers 241 gripping the grid G to the first cylinder 210, and is provided at the lower end of the first cylinder 210. The tweezer fixing portion 220 is provided with a magnet 221 on one surface thereof, and a coupling groove 222 is preferably formed. In other words, the tweezer fixing portion 220 is formed of an aluminum plate on one surface thereof, and the magnet 221 is preferably disposed inside the aluminum plate.

The tweezer adapter 230 is provided with an iron plate 231 on one surface thereof and comes into contact with one surface of the tweezer fixing portion 220 to be coupled. That is, the iron plate 231 provided on one surface of the tweezer adapter 230 may be coupled to the tweezer fixing portion 220 by the magnet 221 of the tweezer fixing portion 220. Since the tweezer adapter 230 and the tweezer fixing portion 220 are coupled by the magnet 221, thereby being easily detachable. The tweezer adapter 230 has a tweezer receiving groove 232 formed at a lower end thereof. The tweezers receiving groove 232 is provided into which the tweezers 241 is inserted and is formed to open one side. In addition, the tweezer adapter 230 further includes a protrusion portion 233 protruding on one surface thereof.

The protrusion portion 233 is formed to correspond to the coupling groove 222. That is, when the iron plate 231 of the tweezer adapter 230 and one surface of the tweezer fixing portion 220 come into contact with each other to be coupled, the protrusion portion 233 is preferably inserted and disposed in the coupling groove 222. Since the protrusion portion 233 is inserted and disposed in the coupling groove 222, it is possible to prevent the tweezer adapter 230 from being detached in the vertical direction after being coupled to the tweezer fixing portion 220.

The tweezer portion 240 is provided to grip the grid G, one end is coupled to the tweezer adapter 230, and the other end grips the grid G. The tweezer portion 240 may include tweezers 241 and a tweezer holder 242.

The tweezers 241 are provided to grip the grid G, and one end is insertably coupled to the tweezers receiving groove 232 and the other ends are formed to be spaced apart from each other. The tweezers 241 are preferably formed of an elastic material, and the grid G can be gripped and separated by narrowing and widening the interval between the other ends. Meanwhile, one end of the tweezers 241 may be inserted into the tweezer receiving groove 232 and fixed by a screw 2321.

The tweezer holder 242 is provided to maintain a state where the tweezers 241 grips the grid G and is formed in a "c" shape. The tweezer holder 242 can maintain a gripped state of the grid G by inserting the tweezers 241 into the open side of the "c" shape so that the interval between the other ends of the tweezers 241 is maintained in a narrowed state. That is, a width of the tweezer holder 242 is preferably formed to correspond to a width of the gripped state by the tweezers 241. After the grid G is gripped by the other ends of the tweezers 241, the tweezers 241 may maintain the gripped state of the grid G by extrapolating the tweezer holder 242 to the tweezers 241. Since the tweezer holder 242 is formed in the "c" shape, it is easy to release the tweezers 241 after fixing the gripped state of the grid G by the tweezers 241.

The second camera 250 photographs the grid unit 200 to check the position of the grid G, is provided inside the frame 100, and photographs the grid G gripped by the grid unit 200. In other words, the second camera 250 is preferably provided inside the front surface 102 of the frame 100 and after closing the inside of the frame 100 by the front surface 102, the second camera 250 photographs the grid G using the second camera 250, and thereby the position of the grid G can be grasped in real time.

The filter unit 300 is provided to selectively absorb the protein liquid P in the hole H of the grid G and is provided to be movable on one inner surface of the frame 100. That is, the filter unit 300 may absorb the protein liquid P of the grid G gripped at one end of the grid unit 200. The filter unit 300 may include a second cylinder 310, a moving frame 320, a filter holder 330, a filter magnet body 340, and a filter paper 350.

The second cylinder 310 slides in a horizontal direction due to expansion and contraction in the frame 100. That is, the second cylinder 310 may slide in the horizontal direction due to expansion and contraction, may move from the inside surface of the frame 100 to a center side, and is preferably expanded by approximately 5 cm. It is preferable that a solenoid valve, an air compressor, and the like are further provided to drive the second cylinder 310, thereby maintaining a constant air pressure of the second cylinder 310, but this is a known technology and a detailed description thereof will be omitted.

The moving frame 320 is coupled to the second cylinder 310 and moves due to the expansion and contraction of the second cylinder 310.

The filter holder 330 protrudes from the moving frame 320 and is formed of iron. That is, the filter holder 330 is provided in the moving frame 320, can move due to the expansion and contraction of the second cylinder 310, and can move from the inside surface of the frame 100 to the center side. It is preferable that the filter holder 330 has a cylindrical shape, may be rotatably provided in the moving frame 320, and is preferably produced by using a small iron micrometer head.

The filter magnet body 340 is formed of a magnet and is coupled to one surface of the filter holder 330. That is, the filter magnet body 340 has one surface formed of a magnet, so that one surface of the filter magnet body 340 and the filter holder 330 may be coupled. In other words, the other end of the filter magnet body 340 is provided with a spherical handle 341 and is formed to facilitate gripping.

The filter paper 350 is provided to absorb the protein liquid P in the hole H of the grid G and is preferably formed in a disk shape. In addition, a grid hole 351 is formed in the filter paper 350 and is formed to have a diameter of about 2 mm. One surface of the filter paper 350 is adhered to the filter magnet body 340 to be fixed and may be disposed on the filter holder 330 by the filter magnet body 340. The filter magnet body 240 is adhered to the center of the filter paper 350 to be coupled. Therefore, the grid hole 351 is preferably formed outside the filter magnet body 340. The filter paper 350 is provided between the filter holder 330 and the filter magnet body 340 and is moved toward a grid G side by the movement of the second cylinder 310, so that one surface thereof comes into contact with the grid G, thereby absorbing the protein liquid P in the hole H of the grid G. In other words, it is preferable that the grid hole 351 of the filter paper 350 and the grid G come into contact with each other.

The laser unit 400 is provided to irradiate the grid G with the laser L to obtain a diffraction image for the grid G and is provided on one side of the filter unit 300. The laser unit 400 is provided in the moving frame 320 and is preferably moved together with the filter unit 300 by the second cylinder 310, and the laser L of the laser unit 400 penetrates the grid hole 351, and then the grid G gripped at one end of the grid unit 200 is irradiated with the laser L. In other words, the grid hole 351 of the filter paper 350 is disposed in a path of the laser L from the laser unit 400, so that the laser L of the laser unit 400 penetrates the grid hole 351 so that the grid G is irradiated with the laser L. Therefore, the laser unit 400 can irradiate the grid G with the laser L while the grid G and the filter paper (350) abut against each other and the liquid P in the hole H of the grid G is selectively absorbed by the filter paper 350.

Meanwhile, in a state where the filter paper 350 is disposed on the filter holder 330, the filter magnet body 340 is moved and thereby the filter paper 350 can be finely adjusted so that the grid hole 351 of the filter paper 350 is disposed in the path through which the center of the laser L passes. In addition, the grid hole 351 of the filter paper 350 may be finely adjusted to be disposed. In addition, the filter paper 350 and the grid G are disposed to be in contact with each other through the second cylinder 310 and then the filter holder 330 is rotated. Therefore, the filter paper 350 can be finely adjusted so that the center of the grid G is disposed in the grid hole 35.

The screen unit 500 is provided to check the diffraction image that appears when the laser L from the laser unit 400 is diffracted by the grid G, and is disposed on the inside surface of the frame 100. The screen unit 500 may include an aluminum plate 510 and a screen paper 520.

The aluminum plate 510 is provided on the inside surface of the frame 100 facing the laser unit 400.

The screen paper 520 is provided on one surface of the aluminum plate 510, and the laser L from the laser unit 400 is diffracted by a grid G, so that a diffraction image may appear on the screen paper 520. In other words, in the diffraction image, the darkest light that passed through the grid G appears at the center portion that is in line with a direction of the irradiation with the laser L, and light that is diffracted while passing through a mesh of the grid G appears by being connected in a form of "x" or "+" in the darkest light appearing at the center. In addition, the light diffracted as the laser L passes through the hole H of the grid G maintains a constant interval and appears as a diffraction point D of a grid arrangement.

The liquid amount analysis unit 600 is provided to determine whether the protein liquid P in the hole H of the grid, G is disposed in an appropriate amount by analyzing the illuminance of the diffraction image appearing on the screen unit 500. The liquid amount analysis unit 600 may include an illuminance sensor unit 610, a data storage unit 620, a liquid amount determination unit 630, a first camera 640, and an image unit 650.

The illuminance sensor unit 610 is provided in the screen unit 500 to measure the illuminance of the diffraction image appeared on the screen unit 500. The illuminance sensor unit 610 may include an illuminance sensor 611 and a sensor moving body 612.

The illuminance sensor 611 is provided in the screen unit 500 to measure the illuminance of the diffraction image appeared on the screen unit 500. That is, the illuminance sensor 611 is provided on one side surface of the screen unit 500, and provided with a magnetic body on one surface thereof. The illuminance sensor 611 is disposed at a position where the diffraction image appears in the screen unit 500 to measure the illuminance of the diffraction image. In other words, by moving the illuminance sensor 611, the laser L passes through the hole H of the grid G and is disposed such that the center of the illuminance sensor 611 is at a diffraction point D appearing due to the diffracted light. The illuminance sensor 611 can detect in real time the illuminance of the diffraction point D that appears when the amount of liquid P in the hole H of the grid G is changed by the filter paper 350.

The sensor moving body 612 is provided to move the illuminance sensor 611, is provided on the other surface of the screen unit 500, and is formed of a magnet corresponding to the magnetic body of the illuminance sensor 611. In other words, the other side of the frame 100 is partially opened, and the sensor moving body 612 may be provided on the other surface of the aluminum plate 510, and the sensor moving body 612 can be moved outside the frame 100. By moving the sensor moving body 612, the magnetic body coupled with the sensor moving body 612 moves to control the position of the illuminance sensor 611.

The data storage unit 620 is connected to the illuminance sensor unit 610 to receive and store the illuminance value of the diffraction image measured by the illuminance sensor unit 610. In other words, the data storage unit 620 stores in real time the illuminance value of the diffraction image measured by the illuminance sensor 611 and may output data regarding the illuminance value as a graph.

The liquid amount determination unit 630 is provided to determine whether the protein liquid P disposed on the grid G is disposed in an appropriate amount, and by analyzing in real time the illuminance value stored in the data storage unit 620 and comparing with the preset illuminance value, it is possible to determine whether the protein liquid disposed on the grid G is disposed in an appropriate amount. That is, the liquid amount determination unit 630 analyzes in real time the change in the illuminance value that appears when the amount of protein liquid P in the hole H of the grid G is changed by the filter paper 350 so that it is possible to determine whether the illuminance value reaches the preset illuminance value, and when reaching the preset illuminance value, it is possible to determine that the protein liquid P is disposed in an appropriate amount in the hole H of the grid G. The liquid amount determination unit 630 determines whether the protein liquid disposed on the grid G is disposed in an appropriate amount, thereby determining the amount of liquid in real time and increasing the efficiency of the production of the grid sample 1.

Meanwhile, the first camera 640 is provided to photograph the diffraction image appeared on the screen unit 500, and is provided on the inside of the frame unit 100. That is, the first camera 640 photographs the diffraction image appeared on the screen unit 500 disposed in front of the first camera 640 to check the diffraction image in real time.

The image unit 650 is connected to the first camera 640 and displays the diffraction image photographed by the first camera 640. In addition, the image unit 650 is connected to the data storage unit 620 to display in real time the illuminance value of the diffraction image measured by the illuminance sensor 611 stored in the data storage unit 620, and can output data on the illuminance value as a graph to appear as an image.

When the liquid amount determination unit 630 determines that an appropriate amount of protein liquid P is disposed in the hole H of the grid G, the quick freezing unit 700 is provided to quickly froze the grid G to produce the grid sample 1 and is provided on the lower side of the frame 100. The quick freezing unit 700 is formed of a communication hole 701 so that the inside thereof communicates with the inside of the frame 100, and the grid G is received from the grid unit 200 to be quickly freezen. The quick freezing unit 700 may include a freezing frame 710, an outer container 720, a freezing cup 730, an inner container 740, and a grid storage container 750.

The freezing frame 710 is provided on the lower side of the frame 100 and the communication hole 701 is formed such that the inside thereof communicates with the inside of the frame 100. That is, the grid G disposed on the frame 100 may be received through the communication hole 701.

The outer container 720 is disposed inside the freezing frame 710. It is preferable that the outer container 720 is formed in a cylindrical shape, such that a space is formed therein, and nitrogen is accommodated on an inside of the outer container 720.

The freezing cup 730 is provide to quick freeze the receiving grid G, is provided at an inner center of the outer container 720, and accommodates liquid ethane therein. That is, the received grid G may be quickly frozen by liquid ethane accommodated in the freezing cup 730. The freezing cup 730 receives the grid G, which is determined that the protein liquid P in the hole H of the grid G is disposed in an appropriate amount, from the liquid amount determination unit 630 and quickly freezes the grid G. Therefore, vitreous ice is formed appropriately so that it is possible to produce the grid sample 1 that provides a high-resolution image. Meanwhile, the grid G may be transferred to the freezing cup 730 by passing through the communication hole 701 in a state of being gripped by the tweezers 241 by further expanding the first cylinder 210.

The inner container 740 is provided between the outer container 720 and the freezing cup 730, and a space is formed along an outer circumference of the freezing cup 730. It is preferable that the inner container 740 is made of hard urethane.

The grid storage container 750 receives and stores a plurality of quick-frozen grid samples 1 from the freezing cup 730. The grid storage container 750 is disposed in the space of the inner container 740 and formed in a cylindrical shape. It is preferable that at least one grid storage container 750 is provided, and heights of the plurality of grid storage containers 750 are preferably formed to be different from each other. In other words, after the tweezer adapter 230 is separated from the tweezer fixing portion 220 to accommodate the grid sample 1 in the grid storage container 750, the tweezer holder 242 extrapolated to the tweezers 241 is separated, and then the grid sample 1 may be disposed in the grid storage container 750.

On the other hand, a lower surface of the freezing frame 710 is provided to slide, and the outer container 720 provided in the freezing frame 710 is movable by the sliding movement of the lower surface thereof, and thereby it is easy to take out the grid G provided in the grid storage container 750 to the outside. In addition, the inside of the freezing frame 710 is provided with lighting, it is possible to secure a view when the grid sample 1 is separated from the tweezers 241.

The control unit 900 is connected to the liquid amount analysis unit 600, the filter unit 300, and the grid unit 200, and when it is determined that the protein liquid P in the hole H of the grid G analyzed by the liquid amount analysis unit 600 is disposed in an appropriate amount, horizontally moves the filter unit 300 to control the filter paper 350 and the grid G to move away from each other, and moves the grid unit 200 downward to control the grid G to automatically transfer to the quick freezing unit 700. That is, the control unit 900 may control the movement of the grid unit 200 and the filter unit 200, is connected to the liquid amount analysis unit 600, and receives a signal for determining that the protein liquid in the hole H of the grid G is disposed in an appropriate amount by the liquid amount determination unit 630 to automatically drive the second cylinder 310 of the filter unit 200. Therefore, the control unit 900 performs control such that the filter paper 350 and the grid G to move away from each other, and after that, the first cylinder 210 of the grid unit 200 is automatically expanded to transfer the grid G to the inside of the freezing cup 730. Accordingly, the grid sample 1 can be quickly cooled, thereby increasing the production efficiency of the grid sample 1.

The humidity control device 800 is provided to control the humidity inside the frame 100 and is provided on the rear side of the frame 100. The humidity control device 800 may include a humidity sensor 810, a humidification frame 820, cooling fins 830, a humidity control paper 840, and a cooling fan 850.

The humidity sensor 810 may be provided inside the frame 100 to measure the humidity inside the frame 100.

The humidification frame 820 is provided on the rear side of the frame 100 and accommodates water.

The cooling fins 830 are provided on one side of the humidification frame 820. That is, it is preferable that the cooling fins 830 are partially disposed so as to be submerged in the water of the humidification frame 820.

One side of the humidity control paper 840 is provided in the water of the humidification frame 820 and is disposed along the cooling fins 830, and the other side is disposed inside the frame 100. The humidity control paper 840 is made of a paper material that absorbs water well but does not break easily, and may be disposed in zigzag along the cooling fins 830. The humidity control paper 840 absorbs water contained in the humidification frame 820 to adjust the humidity of the frame 100.

The cooling fan 850 is provided on one side of the cooling fins 830 and rotates to adjust the humidity of the frame 100. The cooling fan 850 rotates in response to a humidity measurement value of the humidity sensor 810, and the water is evaporated from the humidity control paper 840 disposed on the cooling fins 830 by the rotation to control the humidity inside the frame 100. In other words, the cooling fan 850 may rotate such that the humidity inside the frame 100 is maintained at a level of 90%.

Meanwhile, the grid sample production apparatus 10 for an electron microscope of the present invention may further include an instrument panel 920 that displays the temperature and humidity of the frame 10, and switches 910 to control driving of the first cylinder 210, the second cylinder 310, the illuminance sensor 611, or the like. This is a known technology and a detailed description thereof will be omitted.

Figure 15:
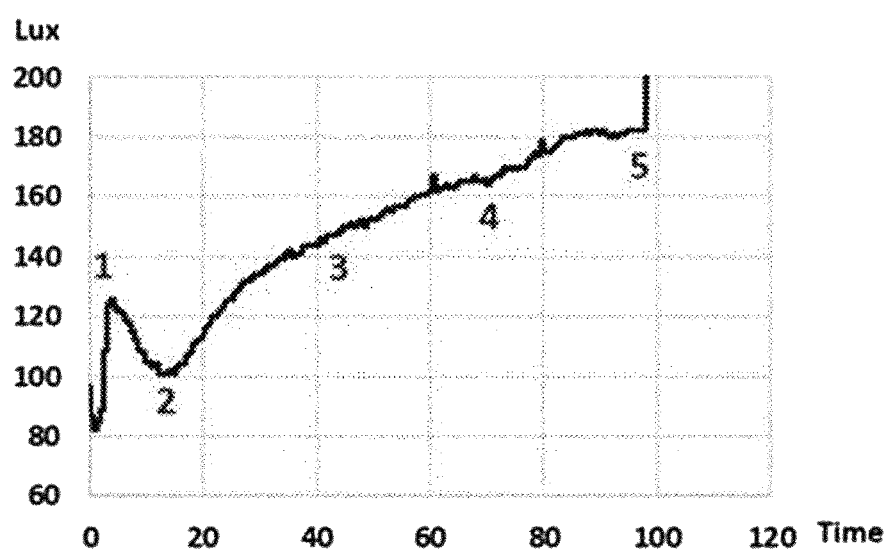
FIG. 15 is an experimental graph illustrating an analysis in real time of a changes in an illuminance value appearing in accordance with a change in an amount of protein liquid disposed in holes of the grid by using the liquid amount analysis unit of the grid sample production apparatus for an electron microscope of the present invention.
Figure 16:
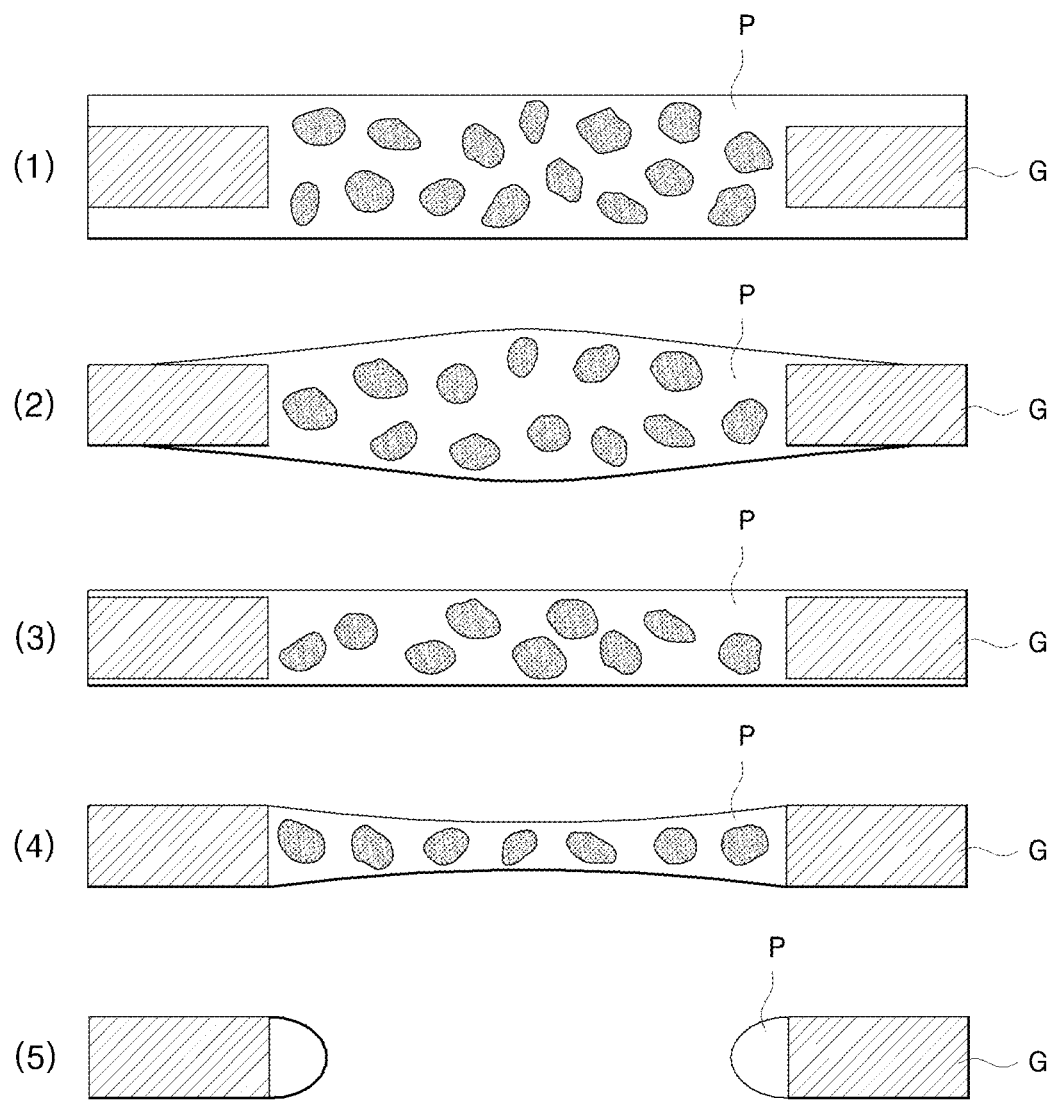
FIG. 16 is a sectional view illustrating a state of the protein liquid disposed in the hole of the grid at each of points 1, 2, 3, 4, and 5 of the experimental graph of FIG. 15.

Meanwhile, FIG. 15 is an experimental graph illustrating an analysis in real time of a change in an illuminance value appearing in accordance with a change in an amount of the protein liquid P disposed in hole H of the grid G by using the liquid amount analysis unit 600 of the grid sample production apparatus 10 for an electron microscope of the present invention, and FIG. 16 is a view predicting and illustrating the amount of the protein liquid P disposed in the hole H of the grid G at each point of 1, 2, 3, 4, and 5 of the experiment graph of FIG. 15.

In FIGS. 15 and 16, the portion indicated by 1 represents a state immediately after loading a sample of the protein liquid P into the hole H of the grid G, and the portion indicated by 2 represents a state where the filter paper 350 absorbs the sample of the protein liquid P in the hole H of the grid G, and the protein liquid P presents in a form in which a center portion thereof is convex due to the surface tension of the holes H of the grid G while the sample of the protein liquid P in the holes H of the grid G is absorbed by the filter paper 350. At this time, the illuminance value appears to be the lowest. In addition, the portions indicated by 3 and 4 represent a state where the protein liquid P, which was formed in the holes H of the grid G with the convex center, is further absorbed by the filter paper 350 and then becomes flat. At this time, it can be seen that the illuminance value continuously increases. Finally, the portion indicated by 5 represents a state where the protein liquid P, which can be absorbed in the holes H of the grid G, no longer remains.

As a result of analyzing the illuminance value measurement through the experiments of FIGS. 15 and 16, an appropriate amount of protein liquid P is disposed in the holes H of the grid G in the states indicated by 3 and 4. After the state of 4, the protein liquid P is cut off, and the grid G falls to the freezing cup 730 of the quick freezing unit 700. In a case where the grid G is quickly frozen in the freezing cup 730, it can be seen that vitreous ice is formed and the grid sample 1 providing a high-resolution image can be produced.

Figure 17:
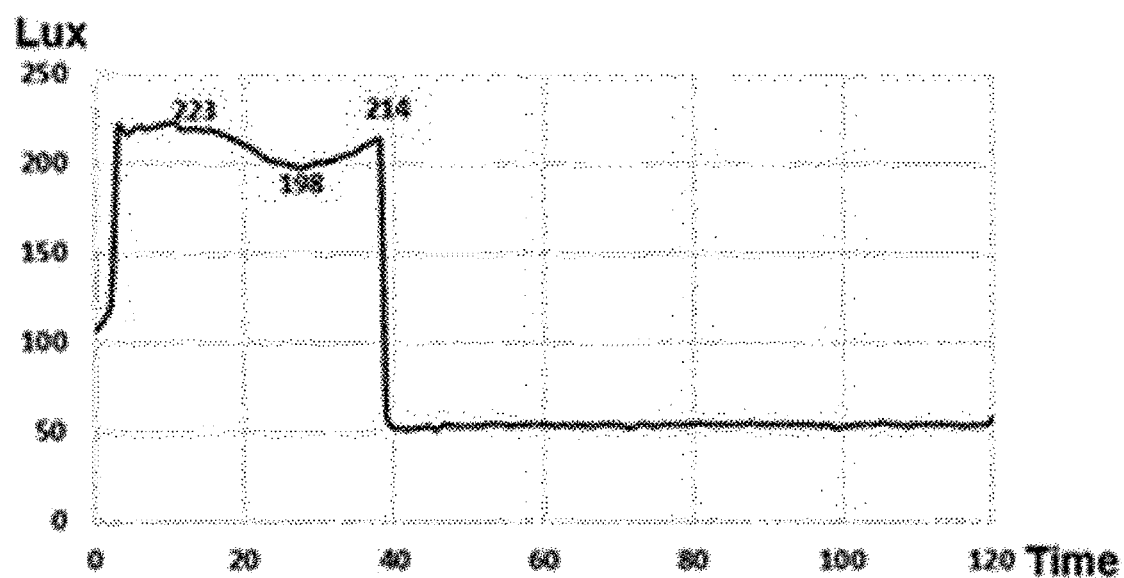
FIG. 17 is a diagram illustrating an experimental graph illustrating an analysis in real time of the illuminance value by repeating the experiment of FIG. 15.
Figure 18:
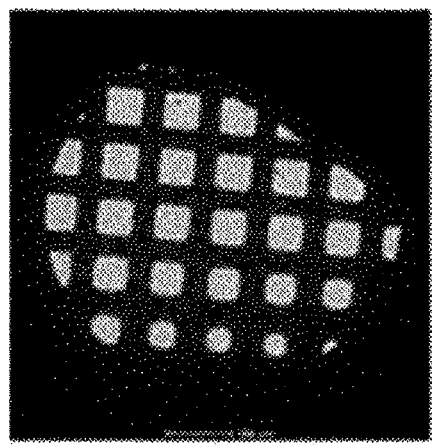
FIG. 18 is an observation image observed after magnifying the grid sample at a low magnification by using the electron microscope in the state 4 of FIGS. 15 and 16.
Figure 19:
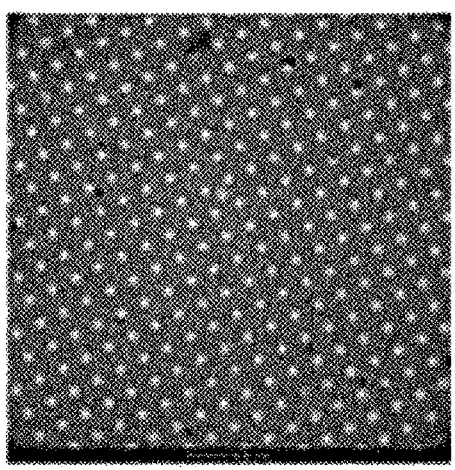
FIG. 19 is an observation image observed after magnifying the grid sample at a high magnification by using the electron microscope in the state 4 of FIGS. 15 and 16.
Figure 20:
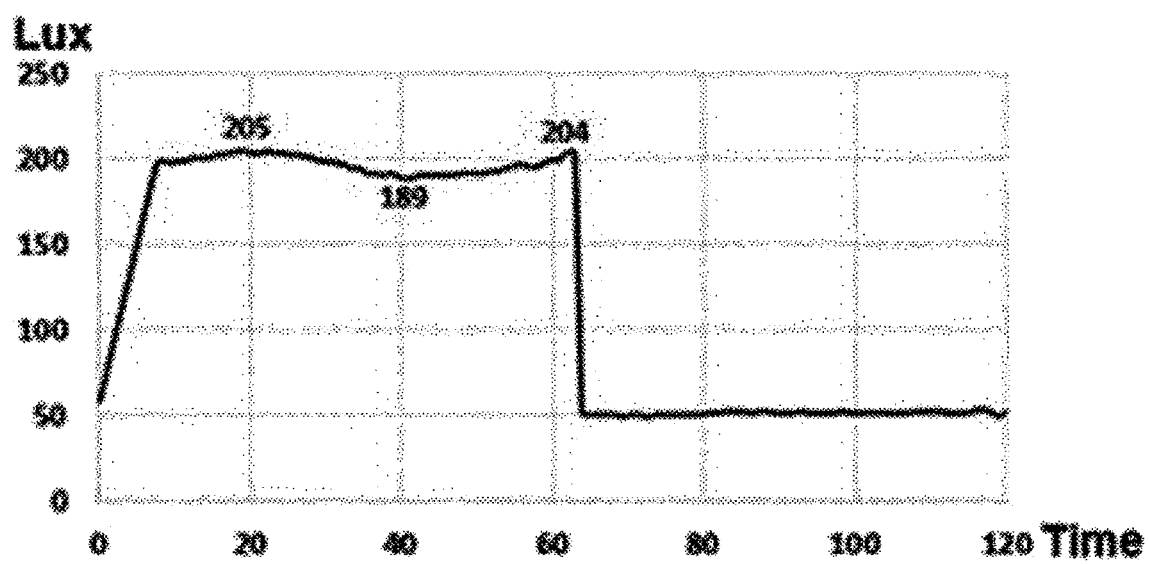
FIG. 20 is another diagram illustrating an experiment graph illustrated by analyzing the illuminance value in real time by repeating the experiment of FIG. 15.
Figure 21:
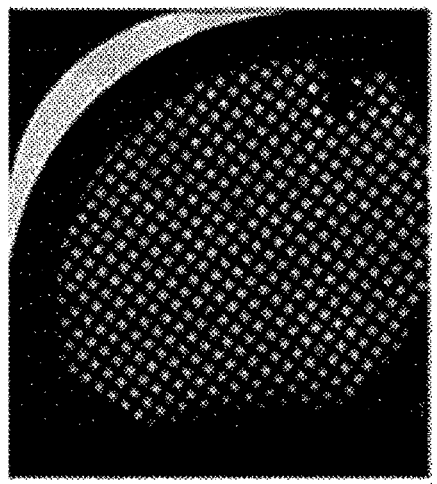
FIG. 21 is an observation image observed after magnifying the grid sample at a low magnification by using the electron microscope in the state 4 of FIGS. 15 and 16.
Figure 22:
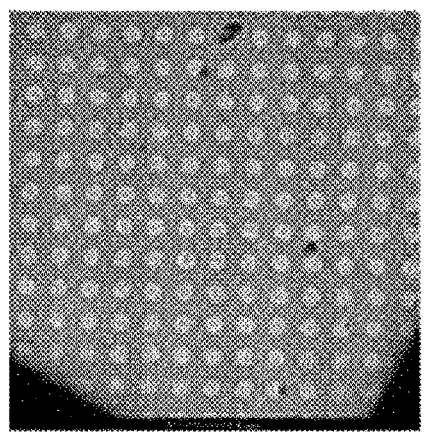
FIG. 22 is an observation image observed after magnifying the grid sample at a high magnification by using the electron microscope in the state 4 of FIGS. 15 and 16.
Figure 23:
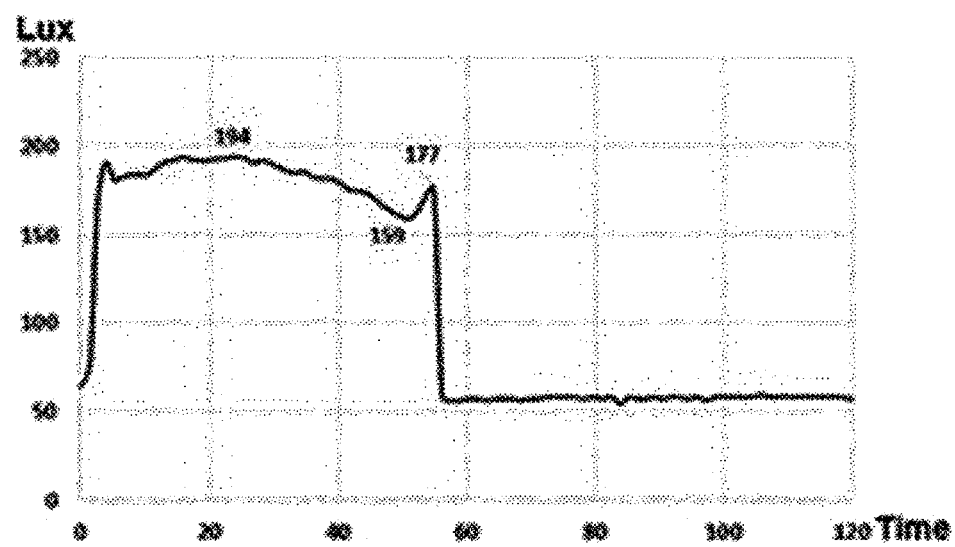
FIG. 23 is another diagram illustrating an experiment graph illustrated by analyzing the illuminance value in real time by repeating the experiment of FIG. 15.
Figure 24:
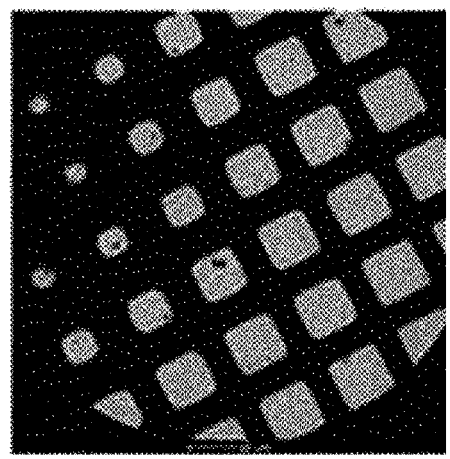
FIG. 24 is an observation image observed after magnifying the grid sample at a low magnification by using the electron microscope in the state 4 of FIGS. 15 and 16.
Figure 25:
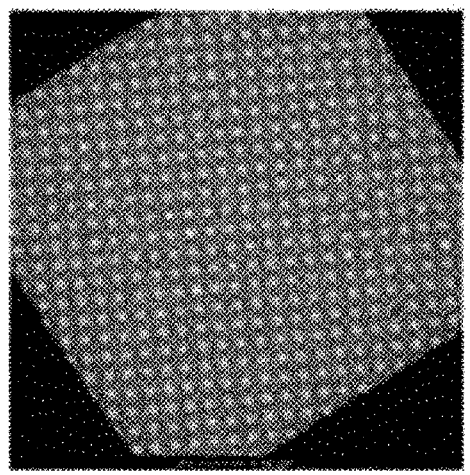
FIG. 25 is an observation image observed after magnifying the grid sample at a high magnification by using the electron microscope in the state 4 of FIGS. 15 and 16, FIGS. 26 and 27 are observation images observed after magnifying the grid sample at a high and low magnification by using the electron microscope in the state 4 of FIG. 15.

FIGS. 17, 20, and 23 are obtained by repeatedly performing the experiments of FIGS. 15 and 16, and are graphs illustrating that the change of the illuminance value of the illuminance sensor 611 appearing in accordance with the amount of protein liquid P in the holes H of the grid G is analyzed in real time. FIGS. 18 and 19 are observation images observed after magnifying the grid sample 1 correspond to the state indicated by 4 of FIGS. 15 and 16 at a low magnification and high magnification by using the electron microscope. FIGS. 21 and 22 are observation images observed after magnifying the grid sample 1 correspond to the state indicated by 4 of FIGS. 15 and 16 at a low magnification and high magnification by using the electron microscope. FIGS. 24 and 25 are observation images observed after magnifying the grid sample 1 correspond to the state indicated by 4 of FIGS. 15 and 16 at a low magnification and high magnification by using the electron microscope.

Figure 26:
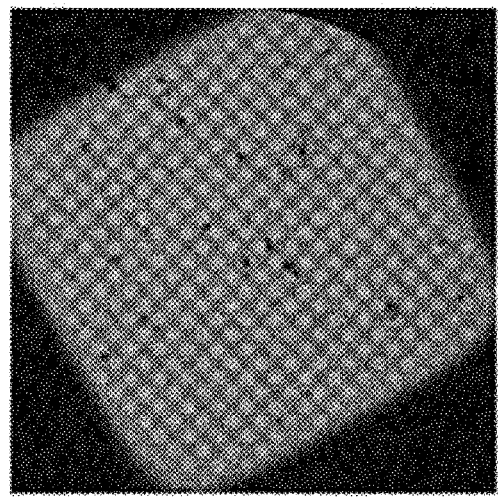
FIGS. 26 and 27 are enlarged.
Figure 27:
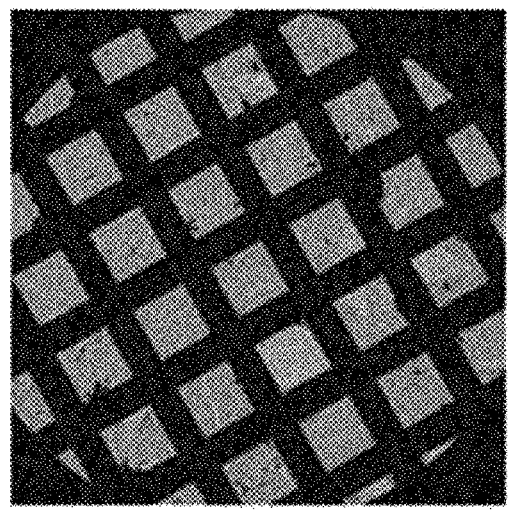
Figure 28:
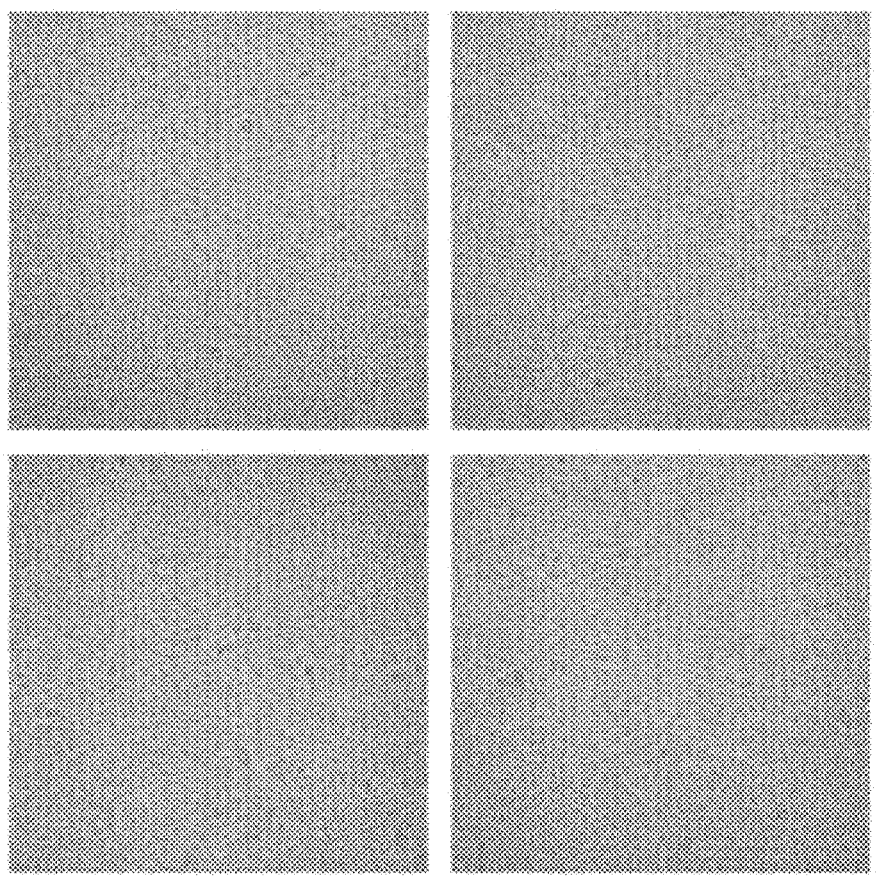
FIG. 28 is an enlarged observation image of protein illustrated when

In experimental parameters of FIGS. 17 to 25, the protein liquid P is MoxR (0.5 mg/ml), a buffer composition is 20 (mM Tris pH 8.0), 150 (mM NaCl), an amount of the protein liquid P loaded on the grid G is 3 micrometer, a glow-discharge is vacuum: 1 minute, and a plasma treatment: 1 minute. In experimental parameters of FIGS. 26 to 28, the protein liquid P is beta galactosidase (0.4 mg/ml), the buffer composition is 20 (mM Tris pH 8.0), 50 (mM NaCl), the amount of protein liquid P loaded on the grid G is 3 micrometer, glow-discharge is vacuum: 1 minute, the plasma treatment: 1 minute. As illustrated in FIGS. 17 to 25, as a result of observing the grid sample 1 in the states 3 and 4, it can be seen that vitreous ice is formed, such that the protein sample is clearly observed through the electron microscope.

In the grid sample production apparatus for an electron microscope according to the present invention, the filter unit moves to selectively absorb the protein liquid in the holes of the grid, and irradiation with the laser is performed in the process of absorbing the liquid, so that the illuminance of the diffraction image of the laser appearing in accordance with the amount of protein liquid in the hole of the grid is analyzed in real time. Therefore, it is possible to determine whether the protein liquid is disposed in an appropriate amount in the hole of the grid, so that the grid production efficiency can be improved.

In addition, when it is determined that the protein liquid of the grid analyzed by the liquid amount analysis unit is disposed in an appropriate amount by the control unit, the grid is automatically transferred to the quick freezing unit and frozen, so that ice of a certain thickness can be quickly and accurately formed. Therefore, it is possible to quickly obtain the grid sample which provides an image with high resolution at low cost, and thereby production efficiency can be improved.

The present invention is described with reference to the embodiments illustrated in the drawings, but these are merely exemplary, and those of ordinary skill in the art will appreciate that various modifications and equivalent other embodiments are possible therefrom. Therefore, the true technical protection scope of the present invention should be determined by the technical spirit of the appended claims.

INDUSTRIAL APPLICABILITY

The present invention can be used to produce a grid sample for an electron microscope.

The invention claimed is:

1. A grid sample production apparatus for an electron microscope for producing a grid sample in which a protein liquid is disposed in an appropriate amount in holes of a grid in which a plurality of holes are formed, the grid sample production apparatus comprising:
   a frame in which an internal space is formed;
   a grid unit which is vertically provided on an upper side of the frame, provided so as to move up and down, and grips a grid at a lower end;
   a filter unit which is provided to be movable inside the frame and selectively absorbs the protein liquid of the grid gripped at one end of the grid unit;
   a laser unit which is provided on one side of the filter unit to irradiate the grid disposed at one end of the grid unit with a laser;
   a screen unit which is disposed inside the frame and on which a diffraction image appears by the laser from the laser unit by being diffracted by the grid; and
   a liquid amount analysis unit which analyzes an illuminance of the diffraction image appeared on the screen unit and determines whether the protein liquid of the grid is disposed in an appropriate amount.

2. The grid sample production apparatus for an electron microscope according to claim 1,
   wherein the grid unit includes
   a first cylinder which is vertically provided at an upper portion of the frame and slides in a vertical direction by expansion and contraction,
   a tweezer fixing portion which is provided at a lower end of the first cylinder and has a magnet on one surface,
   a tweezer adapter which is provided with an iron plate on one surface, is coupled to one surface of the tweezer fixing portion by being in contact therewith, and has a tweezer receiving groove formed at a lower end thereof, and
   a tweezer portion which has one end inserted into the tweezer receiving groove to be coupled and the other ends gripping the grid.

3. The grid sample production apparatus for an electron microscope according to claim 1,
   wherein the tweezer fixing portion is further formed of a coupling groove on one surface thereof, and
   wherein the tweezer adapter is further provided with a protrusion portion corresponding to the coupling groove on one surface thereof, and the protrusion portion is inserted into the coupling groove to be disposed.

4. The grid sample production apparatus for an electron microscope according to claim 1,
   wherein the tweezer portion includes
   tweezers that grip the grid between the other ends spaced apart from each other, and
   a tweezer holder that is formed in a "c" shape and maintains a gripped state of the grid by inserting the tweezers to an open side thereof.

5. The grid sample production apparatus for an electron microscope according to claim 1,
   wherein the filter unit includes
   a second cylinder which slides in a horizontal direction by expansion and contraction on one inner surface of the frame,
   a moving frame which is coupled to the second cylinder to move,
   a filter holder which protrudes from the moving frame and is formed of iron, a filter magnet body which is formed of a magnet and coupled to one surface of the filter holder, a filter paper which has one surface that adheres to the filter magnet body, is disposed on the filter holder, is formed of the grid holes, and allows one surface to come into contact with the grid by the movement of the second cylinder to absorb the liquid from the grid.

6. The grid sample production apparatus for an electron microscope according to claim 5, wherein the laser unit is provided in the moving frame, moved by the second cylinder, and irradiates the grid with a laser penetrating through the grid hole.

7. The grid sample production apparatus for an electron microscope according to claim 1, wherein the screen unit includes an aluminum plate provided on the other inner surface of the frame, and a screen paper which is provided on one surface of the aluminum plate and on which the diffraction image appears.

8. The grid sample production apparatus for an electron microscope according to claim 1, wherein the liquid amount analysis unit includes an illuminance sensor unit which is provided on the screen unit to measure an illuminance of the diffraction image appeared on the screen unit, a data storage unit which is connected to the illuminance sensor unit to receive and store an illuminance value measured by the illuminance sensor unit; and a liquid amount determination unit which analyzes in real time the illuminance value stored in the data storage unit and compares the illuminance value with a preset illuminance value to determine whether the protein liquid disposed in the grid is disposed in an appropriate amount.

9. The grid sample production apparatus for an electron microscope according to claim 8, wherein the liquid amount analysis unit further includes a first camera which is provided on one inner surface of the frame unit to photograph a diffraction image appeared on the screen unit, and wherein the data storage unit further includes an image unit which is connected to the first camera to display a diffraction image photographed by the first camera.

10. The grid sample production apparatus for an electron microscope according to claim 8, wherein the illuminance sensor unit includes an illuminance sensor which is provided on the other inner surface of the frame and provided with a magnetic body on one surface thereof, and a sensor moving body which is provided on the other surface of the screen unit and formed of a magnet corresponding to the magnetic body of the illumination sensor to control a position of the illumination sensor.

11. The grid sample production apparatus for an electron microscope according to claim 1, further comprising:

a quick freezing unit which is provided on a lower side of the frame, formed of a communication hole such that an inside thereof communicates with the inside of the frame, and receives the grid from the grid unit for rapid freezing.

12. The grid sample production apparatus for an electron microscope according to claim 11, wherein the quick freezing unit includes a freezing frame which is provided on the lower side of the frame and formed of a communication hole such that an inside thereof communicates with the inside of the frame, an outer container which is disposed inside the freezing frame, a freezing cup which is provided at a center on an inside of the outer container and accommodates liquid ethane therein to receive the grid for rapid freezing, an inner container which is provided between the outer container and the freezing cup, and has a space formed along an outer circumference of the freezing cup, and a grid storage container which is disposed in the space of the inner container to receive and store a plurality of quick-frozen grids.

13. The grid sample production apparatus for an electron microscope according to claim 11, further comprising:

a control unit which is connected to the liquid amount analysis unit, the filter unit, and the grid unit, and when it is determined that the protein liquid of the grid hole analyzed by the liquid amount analysis unit is disposed in an appropriate amount, controls the filter unit to move horizontally so that the filter paper and the grid are separated from each other, and controls the grid unit to be moved downward to automatically transfer the grid to the quick freezing unit.

14. The grid sample production apparatus for an electron microscope according to claim 1, further comprising:

a humidity control device which is provided on a rear side of the frame and communicates with the inside of the frame to control a humidity inside the frame.

15. The grid sample production apparatus for an electron microscope according to claim 14, wherein the humidity control device includes a humidity sensor provided inside the frame, a humidification frame provided on the rear side of the frame and accommodating water, cooling fins provided on one side of the humidification frame, a humidity control paper having one side that is provided in the humidification frame and is disposed along the cooling fins, and the other side that is disposed inside the frame, and a cooling fan provided on one side of the cooling fins and rotating in response to the humidity measurement value of the humidity sensor to evaporate water from the humidity control paper disposed on the cooling fins to control the humidity in the frame.

\* \* \* \* \*